(12) United States Patent
Nowack et al.

(10) Patent No.: US 6,215,831 B1
(45) Date of Patent: *Apr. 10, 2001

(54) DECODER CIRCUIT USING BIT-WISE PROBABILITY AND METHOD THEREFOR

(75) Inventors: Joseph Michael Nowack, Schaumburg; Bruce Dale Mueller, Palatine, both of IL (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/900,073

(22) Filed: Jul. 24, 1997

Related U.S. Application Data

(63) Continuation of application No. 08/414,258, filed on Mar. 31, 1995, now abandoned.

(51) Int. Cl.[7] .......................... H03M 13/00; H03D 1/00; H04L 27/06; H04L 23/02
(52) U.S. Cl. ...................... 375/340; 375/266; 714/792; 714/796
(58) Field of Search ..................... 375/340, 324, 375/341, 262, 265, 260, 266; 371/35, 43.1, 43.7, 43.4, 43.6, 43.8; 341/81; 714/786, 792, 794, 795, 796

(56) References Cited

U.S. PATENT DOCUMENTS

| 4,709,377 | 11/1987 | Martinez et al. . |
| 4,742,533 | 5/1988 | Weldner et al. ................... 375/331 |
| 4,833,693 | * 5/1989 | Eyeboglu ........................ 375/254 |
| 4,945,549 | * 7/1990 | Simon et al. .................... 375/280 |
| 5,134,635 | * 7/1992 | Hong et al. ..................... 375/341 |
| 5,181,209 | 1/1993 | Hagenauer et al. . |
| 5,214,675 | 5/1993 | Mueller et al. ................... 375/340 |
| 5,398,254 | * 3/1995 | Miya et al. ....................... 371/43 |

FOREIGN PATENT DOCUMENTS

| 0465428A2 | 1/1992 | (EP) ........................... H03M/13/12 |
| 0529909A3 | 8/1992 | (EP) ........................... H03M/13/00 |
| 0700182A1 | 3/1996 | (EP) ............................. H04L/1/00 |

OTHER PUBLICATIONS

Translation of German Patent Application DE43 40 387 C1, Siemens AG, Peter Baldy, Process for Coded Transmission of Speech Signals, Nov. 22, 1994.

N. Seshardri and CE W. Sundberg, "Generalized Viterbi Algorithm for Error Detection with Convolutional Codes", AT&T Bell Laboratories, Murray Hill, NJ 07974, No. CH8682–3/3/89/0000–1534, *IEEE—Globecom*, 1989.

L. R. Bahl, J. Cocke, F. Jelinek and J. Raviv, "Optimal Decoding of Linear for Minimizing Symbol Error Rate", *IEEE Transactions of Information Theory*, Mar. 1974.

Kazuyuki Miya, Osamu Kato, and Kouichi Honma, "Design of Error Correction Methods Using Redundancy of Speech Coder Data", Matsushita Communication Industrial Co., Ltd. 600, Saedo–cho, Midori–Ku, Yokohama 226, Japan, No. 0–7803–0679–2/92, *IEEE—Proceeding of the 1992 Vehicular Technology Conference*, 1992.

* cited by examiner

*Primary Examiner*—William Luther
(74) *Attorney, Agent, or Firm*—Randall S. Vaas; Michael C. Soldner

(57) ABSTRACT

A decoder circuit includes a probability circuit which generates branch metrics using bit-wise probabilities representing frame-to-frame correlation relationships. The branch metrics are input to a decoder which outputs decoded data bits as a function of the bit-wise probabilities for at least predetermined bit positions.

25 Claims, 7 Drawing Sheets

DECODER CIRCUIT USING BIT-WISE PROBABILITY AND METHOD THEREFOR

This is a continuation of application Ser. No. 08/414,258, filed Mar. 31, 1995 and now abandoned.

FIELD OF THE INVENTION

The present invention pertains to communication systems, and more particularly to communication of digital signals.

BACKGROUND OF THE INVENTION

Coders and decoders are employed by transmitters and receivers which communicate information over signal channels. For example, radio telephones, MODEMs, and video systems include low rate or high rate coders to generate digital signals for communication through a signal channel and decoders to decode signals received from the signal channel. The signal channel is a twisted wire pair, a cable, air, or the like.

For example, in low-rate speech or video systems, analog signals are converted to a digital data sequence. This original data sequence is encoded to form a message prior to transmission using a forward-error-correcting code, such as a convolutional code. The encoded signal is transmitted through the signal channel.

The receiver receives a data sequence corresponding to the message. The received sequence may have been corrupted by the signal channel. To detect the original data sequence, the receiver includes a decoder which is capable of maximum-likelihood decoding, or a similar decoding operation. A maximum likelihood decoder employs the following equation:

$$P\{m_i\}p_n(\rho-s_i), \qquad (1)$$

where $P\{m_i\}$ is the a priori probability of the entire message $m_i$ having been transmitted;

$p_n(\ )$ is the multidimensional probability density function of the additive noise from the channel, $\rho$ is the received signal sequence, and $s_i$ is a possible transmitted signal sequence. The decoder selects the message $m_i$ which maximizes equation 1 (i.e., has the highest probability).

It is further known that in the case of additive white Gaussian noise with a variance $\sigma^2$, the receiver should find the message that minimizes:

$$(\rho-s_i)^2-2\sigma^2 \ln P\{m_i\} \qquad (2)$$

The first term, $(\rho-s_i)^2$, is the squared Euclidean distance in the signal constellation between the received signal sequence $\rho$ and a possible signal sequence $s_i$. The second term, $2\rho^2 \ln P\{m_i\}$, takes into consideration the a priori probability of the transmitted message. Receivers that select the message $m_i$ that minimizes equation 2 are called maximum a posterior probability (MAP) receivers.

Although these two equations are widely utilized, there are difficulties in implementing each of them. The a priori code word probabilities are not known precisely at the decoder, making optimum decoding impossible. Furthermore, if messages are equally likely, the second term in equation 2 has no bearing on the decision, and therefor can be omitted, resulting in a maximum likelihood (ML) receiver wherein the variance of the noise and the a priori probabilities of the messages are not considered.

ML decoding is typically implemented in practice using, for example, Viterbi decoding in the case of convolution codes. Viterbi decoders of convolution codes perform error correction on demodulated data by searching for the best path through a "trellis". A section of the trellis is illustrated in FIG. 11. In FIG. 11, the trellis decoder will select path 00 or 10 at point A based upon a "metric" generated from the squared Euclidean distance between the received data sequence and a possible encoded sequence terminating at point A with the last coded bits being either 00 or 10. The metric is calculated as a function of the sum of squared Euclidean distances for previous branches on surviving paths through the trellis plus a metric for the path terminating at that point. The path (00 or 10) having the best metric is selected, and the metric for the best pth is stored. The trellis decoder also selects from paths 11 and 01 for point B using the squared Euclidean distances and the metrics for paths ending at point B. The trellis decoder eliminates the path having the worst metric, and stores the metric associated with the best path. The trellis decoder then repeats the path selection operation for each of the points C and D on the trellis. The metrics are stored for the selected path to each of these points. The Viterbi decoder in this manner performs an add-compare-select (ACS) function at each point in the trellis. The process is repeated until all the points of the trellis frame are processed, and the best path through the trellis frame is selected from the stored metrics.

A prior art decoder has been proposed that uses frame-to-frame correlation of speech code parameters to decode speech signals. This decoder looks at a multi-bit parameter and makes a single path selection decision after evaluating the relationship between a possible parameter value X in a current frame and each of the values Y that the parameter may have had in a previous frame. Thus, for a parameter having five binary bits, the decoder selects one of 32 possible paths between the 32 possible values in a previous frame and a possible value X in a current frame. A single path to a possible value X is selected by considering the probability that the parameter will have this current value X if the previous value was Y for Y having each of the 32 possible previous values Y. This decoder employs a correlation memory, storing thirty-two probability values $P\{X/Y\}$ for this current value X, to make the selection. Each probability value $P\{X/Y\}$ is the probability that the parameter has value X in a current frame if the parameter had value Y in a previous frame. Because there are 32 possible values X for the five binary bit parameter, and 32 possible values Y for each possible value X, the correlation memory must store a 32 by 32 correlation metric matrix for this one parameter. Other parameters will require additional respective, large, metric memories. The resulting parameter-wise decoder using frame-to-frame parameter correlation values is thus very complex to implement.

Accordingly, it is desirable to provide a decoder with improved operating characteristics which does not require a highly complex decoding operation.

DETAILED DESCRIPTION OF THE INVENTION

A communication system includes a decoder which stores correlation values on a bit-by-bit basis. A branch metric is generated for at least predetermined bit positions which takes advantage of the high frame-to-frame correlation of some bits to improve the decoded bit error rate. The system also allows the bits of a frame to be ordered independently of other bits in a parameter. This is particularly advantageous as the Applicant's have ordered the frame bits in a manner which maximizes speech quality, takes advantage of correlation between bit frames, and allows real time reception of the speech signal without a highly complex branch metric generator calculation.

Figure 1:
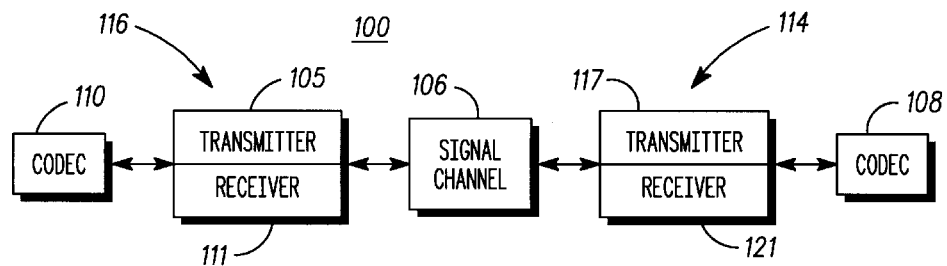
FIG. 1 is a circuit schematic in block diagram form of a communication system.

A communication system 100 in which the invention may be employed is illustrated in FIG. 1. The system includes a transceiver 114 that communicates with a transceiver 116 via signal channel 106. The transceiver 116 employs a transmitter 105 and a receiver 111. The transmitter 105 conditions signals for transmission over the signal channel 106. The receiver 111 conditions signals received from the signal channel 106 for use by downstream circuitry, such as a coder/decoder (CODEC) 110. CODEC 110 encodes signals to be communicated by transceiver 116 and decodes signals received by receiver 111. Transceiver 114 similarly includes a transmitter 117 and a receiver 121. A CODEC 108 is coupled to transceiver 114. The transceiver can include a modulator/demodulator (MODEM), and may be employed by a computer or other device for data communication, a radio, a radio telephone, a landline telephone, or any other communication devices. The transmission medium is one or more twisted wire pairs, one or more coaxial cables, optical fibers, air, or any other conventional communication medium.

Figure 2:
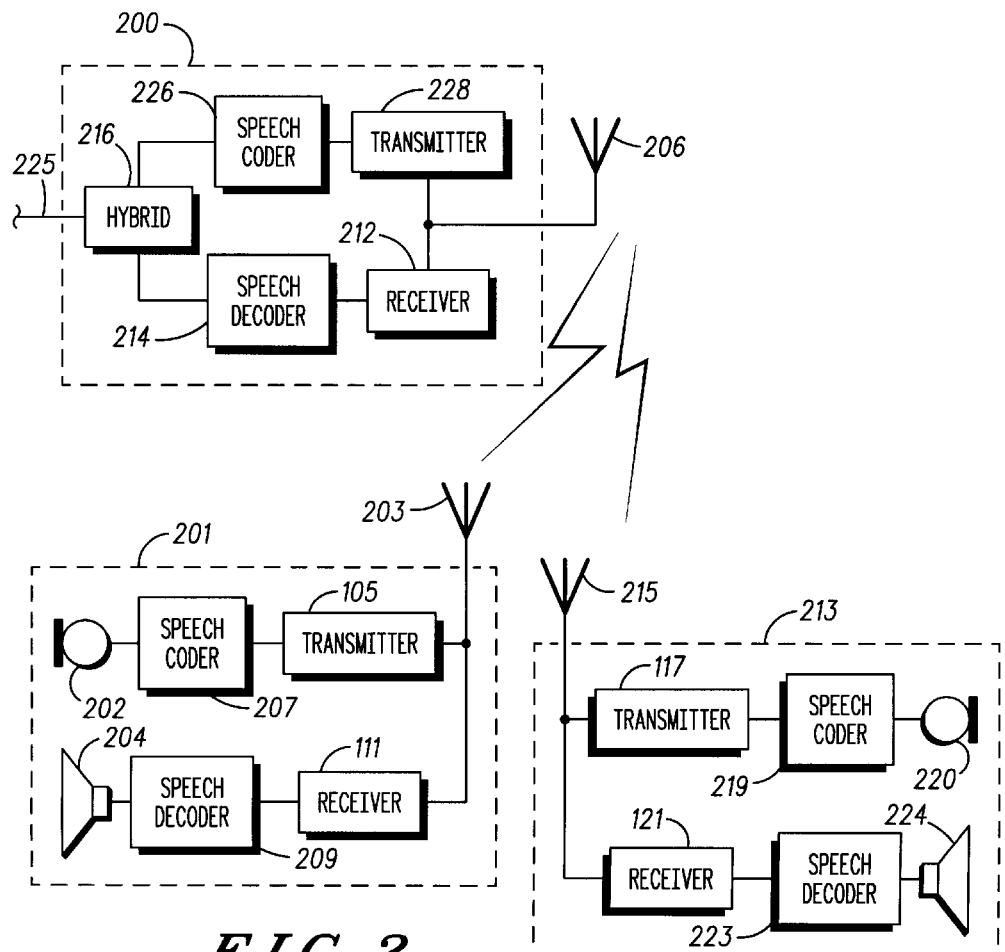
FIG. 2 is a circuit schematic in block diagram form of another communication system.

A radio communication system is illustrated in FIG. 2. The radio communication system includes at least two devices 200, 201 and 213, such as two-way radios, cellular telephones, cordless telephones, base stations, or the like. In the case of cellular radiotelephones, devices 201 and 213 are radiotelephones and device 200 is a fixed site, or base station. Alternatively, for a cordless telephone, the device 200 is a base, and device 201 is an associated cordless handset. For two-way radios, devices 201 and 213 communicate directly.

Regardless of the environment, device 201 (a remote communication device) includes a microphone 202 and a coder circuit 207, which is illustrated as a speech coder, to convert the analog signal output by the microphone into a digital signal applied to transmitter 105. Transmitter 105 modulates the encoded signal and supplies the signal to antenna 203.

Signals received by the communication device 201 are detected by antenna 203 and supplied to receiver 111, which demodulates the signals and outputs a demodulated signal to a decoder circuit 209, which is illustrated as a speech decoder. Decoder circuit 209 converts the signal into an analog signal which drives speaker 204.

The signal communicated to device 200 (a fixed site) from device 201 (a remote communication device) is detected by antenna 206, demodulated by receiver 212, decoded by decoder circuit 214 and input to a hybrid 216. Hybrid 216 separates the receive and transmit paths of the device 200, and supplies the decoded signal output by the decoder to landline 225 for communication to a local office (not shown). Signals received from landline 225 are coupled to coder 226 via hybrid 216. Encoded signals output by coder circuit 226, illustrated as a speech coder, are input to transmitter 228 which drives antenna 206.

Device 213 (a remote communication device) includes an antenna 215, a transmitter 117, and a coder circuit 219, illustrated as a speech coder coupled to microphone 220. The device also includes a receiver 121, a decoder circuit 223, and a speaker 224. The second device operates in substantially the same manner as device 201. Those skilled in the art will recognize that devices 201 and 213 will communicate directly in the case of two-way radios, without device 200.

Figure 3:
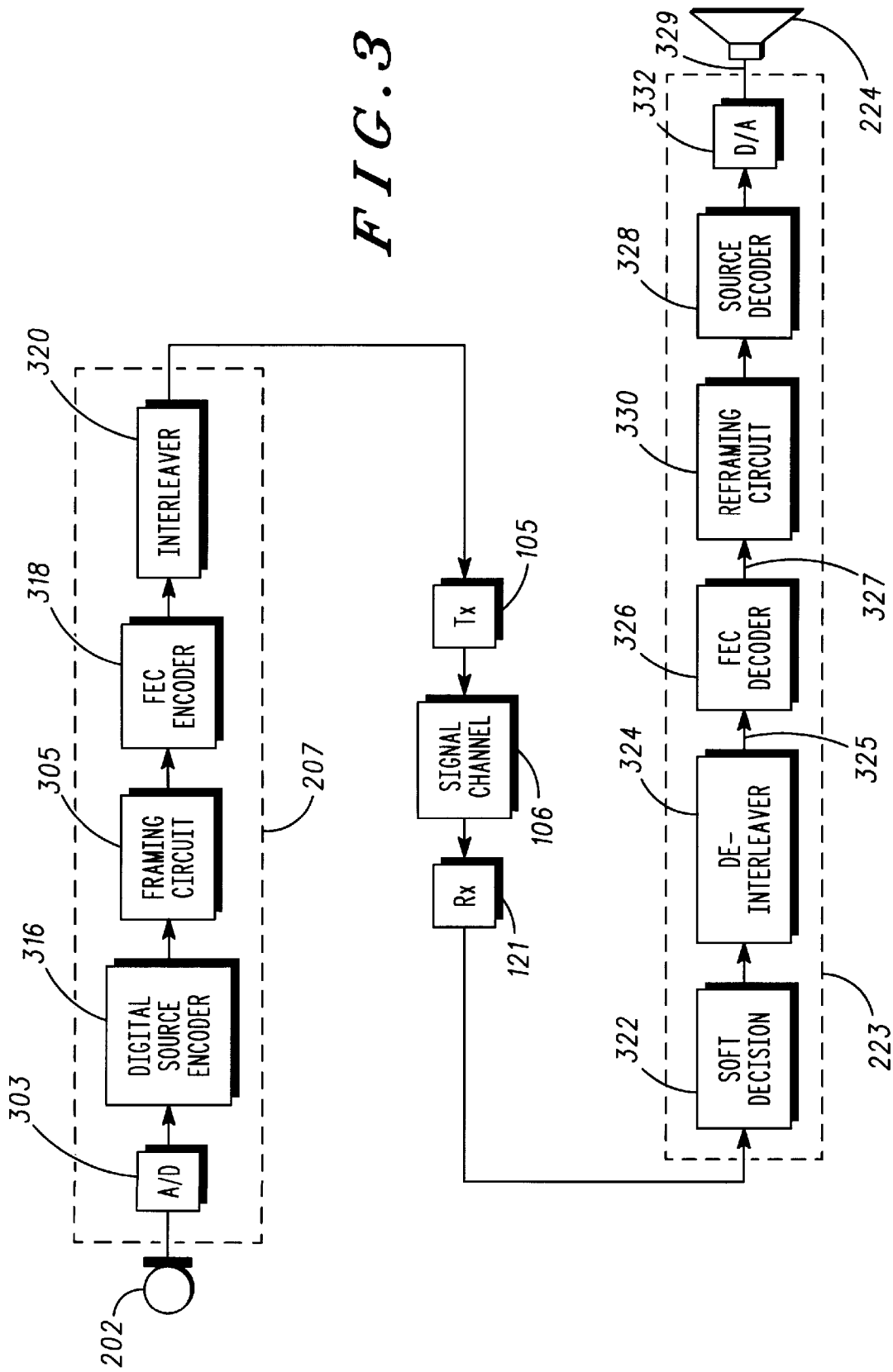
FIG. 3 is a circuit schematic in block diagram form of a digital encoded communication system.

The coder circuit 207 (FIG. 3) includes an analog-to-digital (A/D) converter 303 connected to microphone 202 to convert the analog signals output thereby to digital signals. The coder circuit further includes a digital source encoder 316, a framing circuit 305, a forward error correction (FEC) encoder 318, and an interleaver 320. The digital source encoder 316 generates data sequences for transmission by the transmitter. The framing circuit 305 is connected to encoder 316 to reframe the digital signal output by the digital source encoder. The FEC encoder 318 encodes the data output by the refining circuit. The interleaver 320 interleaves data output by the FEC encoder with other data bits for transmission through the signal channel 106. Although there are advantages to providing interleaver 320, the interleaver can be omitted from the coder circuit 207 since the interleaver is not necessary to the immediate invention. Coder circuits 219 and 226 are of substantially the same construction as coder circuit 207. The coder circuit 207 can be implemented in one or more microprocessors, a digital signal processor, MODEMs, combinations thereof, or discrete circuit components.

Transmitter 105 modulates and amplifies the encoded signal output by coder circuit 207 for transmission over the signal channel 106. Receiver 121 demodulates signals received from the signal channel 106.

The decoder circuit 223 includes a soft decision circuit 322 (FIG. 3), a deinterleaver 324, a FEC decoder 326, a reframing circuit 330, a source decoder 328, and a D/A converter 332. The soft decision circuit 322 converts the signals input from signal channel 106 to predetermined digital levels. Although a soft-decision circuit is illustrated, those skilled in the art will recognize that a hard decision circuit may be employed in place of the soft decision circuit. A deinterleaver 324 is connected to the output of the soft decision circuit to remove the data interleaved by interleaver 320. If the interleaver 320 is omitted from the coder circuit, the deinterleaver 324 is not employed in the decoder circuit 223. The FEC decoder 326 is connected to the output of the deinterleaver 324 to decode the data output thereby. The decoded signal is reframed in refraining circuit 330 and input to source decoder 328. The source decoder 328 decodes the data output by the FEC decoder 326. The output of the source decoder is converted to a digital signal in a digital-to-analog (DIA) converter 332, amplified by an amplifier (not shown), and output to a speaker 224 on conductor 329. Decoder circuits 209 and 214, which are substantially similar to decoder circuit 223, are illustrated as speech decoders. The decoder 223 may be implemented in one or more microprocessors, a digital signal processor, MODEMs, combinations thereof, or discrete circuit elements.

Figure 4:
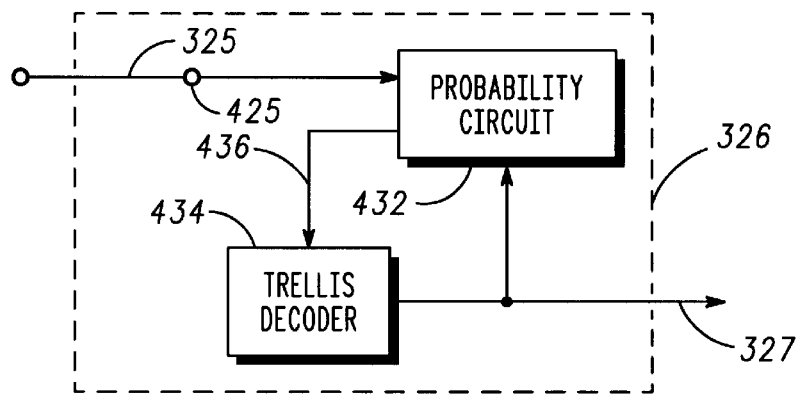
FIG. 4 is a circuit schematic in block diagram form of a decoder according to FIG. 3.

The forward error correction decoder 326 includes a probability circuit 432 (FIG. 4) and a trellis decoder 434. The probability circuit receives deinterleaved data frames on conductor 325 at input 425. Input 425 is coupled to a source of data signals (through antenna 215 of FIG. 2 and receiver 121). Probability circuit 432, which is a branch metric generator, supplies a branch metric for trellis decoder 434 at an output coupled to signal bus 436. The probability circuit generates a branch metric as a function of a bit-wise probability for at least predetermined bit positions as described in greater detail hereinbelow. The trellis decoder outputs a data stream on conductor 327 responsive to the branch metrics.

Figure 5:
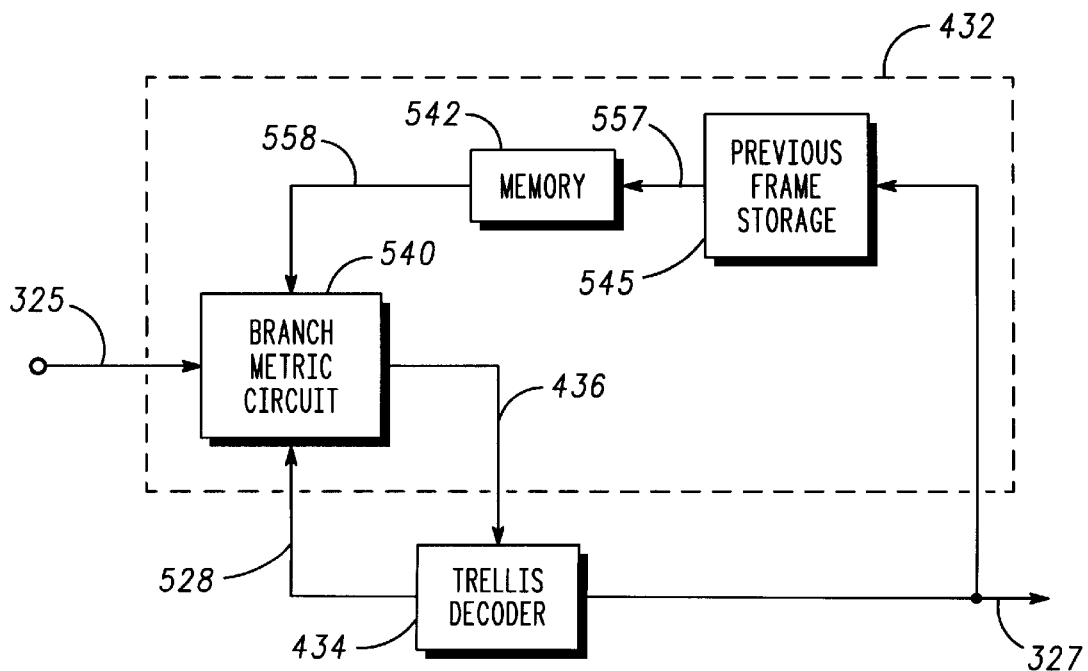
FIG. 5 is a circuit schematic in block diagram form of a decoder according to FIG. 4.

The probability circuit 432 includes a branch metric generator 540 (FIG. 5), a memory circuit 542, which is a frame-to-frame correlation metric memory, and a previous frame storage circuit 545. Previous frame storage circuit 545 retains the previous frame output by the trellis decoder 434, and is implemented using a shift register, a random access memory (RAM) or the like. The memory circuit 542 stores a 2-by-2 probability metric matrix for each bit in a frame. The memory can be implemented using a read only memory (ROM), such as an electronically erasable programmable read only memory (EEPROM), a random access memory (RAM) with battery back-up to prevent power loss thereto, or the like. The output of the memory is generated on a bit-by-bit basis, for each bit in the previous frame.

The values stored in the memory are empirically generated by storing digitized speech, in the form of frame data values of voice signals, over time. The number of times a bit remains 0 or 1 for two sequential frames, and the number of times that a bit value changes over two sequential frames, on a bit position basis, were measured. Probabilities were generated from these counts.

The probabilities output by the memory are supplied to a branch metric generator via a signal bus 558. The branch metric is supplied to trellis decoder 434 via signal bus 436. The possible coded signals are output to the branch metric generator on bus 528. The trellis decoder selects a branch according to the value of the branch metric. If the value of the branch metric is best for one path, the trellis decoder will choose that path. If the value is the same for both paths, the trellis decoder will arbitrary choose a path. The bit value for each bit position is selected from the path through the trellis which is selected. The decoded bits of the trellis decoder are output on conductor 327.

Figure 6:
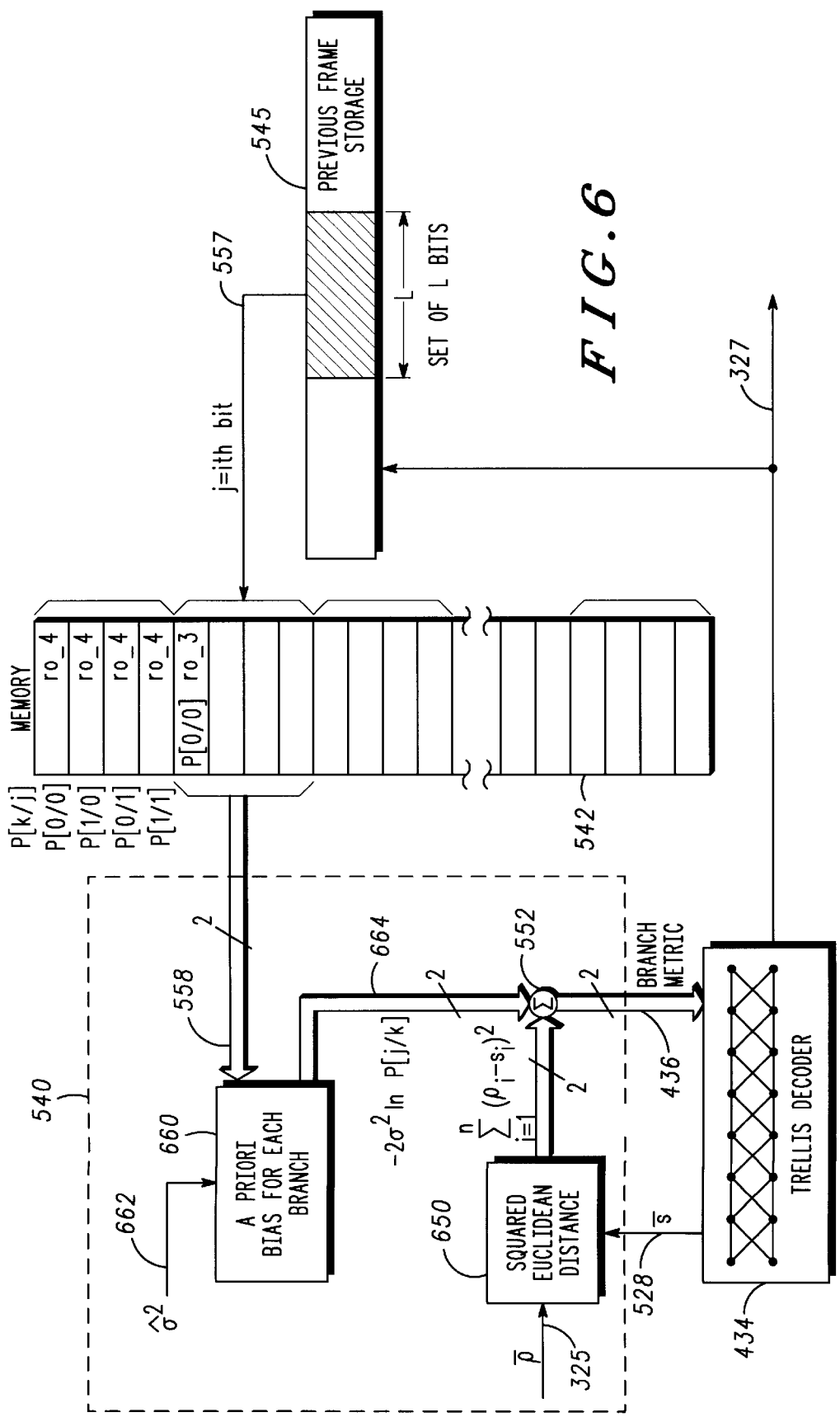
FIG. 6 is a circuit schematic in block diagram form of a decoder according to FIG. 5.

A novel circuit that can be advantageously employed to generate the branch metric is illustrated in FIG. 6. This circuit includes a squared Euclidean distance circuit 650 which generates the summation:

$$\sum_{i=1}^{n} (\rho_i - s_i)^2 \quad (3)$$

where $\rho_i$ is the input data bit, $s_i$ is a possible branch symbol (constellation) output from the trellis decoder 434, and n is the number of symbols per trellis branch. The summation output by the squared Euclidean distance generator is input to an adder 552.

The decoded output data of the trellis decoder 434 on conductor 327 is input to the previous frame storage circuit 545. The L bits in previous frame storage circuit 545 are input to memory circuit 542 on a bit-by-bit basis via conductor 557. For each bit, two probabilities associated with respective a bit in a current frame are output by memory circuit 542 on signal bus 558. One probability is the probability that the bit value will change from frame-to-frame, in view of the bit's position and the bit's value in the previous frame. The other value is the probability that the bit value will have changed, in view of the bit's position and the bit's value in the previous frame. The memory thus receives the previous bit value at an input and outputs the probability that this bit will change and the probability that it will remain the same. The memory circuit output is essentially a sequence of bit-wise frame correlation values associated with at least selected bit positions in the data frames.

The probabilities output by the memory, or frame-to-frame correlation values, are input to an a priori bias circuit 660. The bias circuit combines an estimate of the noise variance, $\hat{\sigma}^2$, on a bus 562, with the two probabilities output by the memory circuit 542, and produces two respective output values, $2\hat{\sigma}^2 \ln P\{j/k\}$, wherein one value is a function of the probability of the bit changing and the other value is a function of the probability of the bit remaining the same. These two values are combined with the Euclidean squared distance summation, in an adder 552, to produce two branch metrics which are coupled to the trellis on bus 436.

A reduction to practice of the invention in a conventional GSM system will now be described as an example. The digital source encoder 316 is a GSM digital speech encoder that outputs a sequence of data blocks, or frames, wherein each frame corresponds to 20 ms of speech, contains 18 parameters, and has a total of 112 bits. The framing circuit 305 produces the parameters in a unique sequence and format. Tables 1 and 2 list the sequence of parameters and the number of bits allocated for each parameter. Table 1 lists the sequence for an unvoiced frame (MODE=0).

TABLE 1

Encoder output parameters in order of real time occurrence and bit allocation for unvoiced speech frames (MODE 0).

| Variable Name (MSB-LSB) | Parameter Number | Parameter Name | No. of bits |
| --- | --- | --- | --- |
| MODE b0–b1 | 0 | voicing mode | 2 |
| R0 b2–b6 | 1 | frame energy | 5 |
| LPC12 b7–b17 | r1–r3 | reflection coeff. | 11 |
| LPC23 b18–b26 | r4–r6 | reflection coeff. | 9 |
| LPC34 b27–b34 | r7–r10 | reflection coeff. | 8 |
| INT_LPC b35 | 5 | interpolation bit | 1 |
| CODE1_1 b36–b42 | 6 | 1st subframe codebook code I | 7 |
| CODE2_1 b43–b49 | 7 | 1st subframe codebook code H | 7 |
| GSP0_1 b50–b54 | 8 | 1st subframe {P0,GS} code | 5 |
| CODE1$_{13}$_2 b55–b61 | 9 | 2nd subframe codebook code I | 7 |
| CODE2_2 b62–b68 | 10 | 2nd subframe codebook code H | 7 |
| GSP0_2 b69–b73 | 11 | 2nd subframe {P0,GS} code | 5 |
| CODE1_3 b74–b80 | 12 | 3rd subframe codebook code I | 7 |

TABLE 1-continued

Encoder output parameters in order of real time occurrence and bit allocation for unvoiced speech frames (MODE 0).

| Variable Name (MSB-LSB) | Parameter Number | Parameter Name | No. of bits |
|---|---|---|---|
| CODE2_3 b81–b87 | 13 | 3rd subframe codebook code H | 7 |
| GSP0_3 b88–b92 | 14 | 3rd subframe {P0,GS} code | 5 |
| CODE1_4 b93–b99 | 15 | 4th subframe codebook code I | 7 |
| CODE2_4 b100–b106 | 16 | 4th subframe codebook code H | 7 |
| GSP0_4 b107–b111 | 17 | 4th subframe {P0,GS} code | 5 |

Table 2 lists the sequence for a voiced frame (MODES) = 1, 2, or 3).

TABLE 2

Encoder output parameters in order of real time occurrence and bit allocation for voiced speech frames (MODE 1, 2, 3).

| Variable Name (MSB-LSB) | Parameter Number | Parameter Name | Number of bits |
|---|---|---|---|
| MODE b0–b1 | 0 | voicing mode | 2 |
| R0 b2–b6 | 1 | frame energy | 5 |
| LPC12 b7–b17 | r1–r3 | reflection coeff. | 11 |
| LPC23 b18–b26 | r4–r6 | reflection coeff. | 9 |
| LPC34 b27–b34 | r7–r10 | reflection coeff. | 8 |
| INT_LPC b35 | 5 | interpolation bit | 1 |
| LAG_1 b36–b43 | 6 | 1st subframe lag | 8 |
| CODE_1 b44–b52 | 7 | 1st subframe codebook code | 9 |
| GSP0_1 b53–b57 | 8 | 1st subframe {P0,GS} code | 5 |
| LAG_2 b58–b61 | 9 | 2nd subframe lag delta | 4 |
| CODE_2 b62–b70 | 10 | 2nd subframe codebook code I | 9 |
| GSP0_2 b71–b75 | 11 | 2nd subframe {P0,GS} code | 5 |
| LAG_3 b76–b79 | 12 | 3rd subframe lag delta | 4 |
| CODE_3 b80–b88 | 13 | 3rd subframe codebook code I | 9 |
| GSP0_3 b89–b93 | 14 | 3rd subframe {P0,GS} code | 5 |
| LAG_4 b94–b97 | 15 | 4th subframe lag delta | 4 |
| CODE_4 b98–b106 | 16 | 4th subframe codebook code I | 9 |
| GSP0_4 b107–b111 | 17 | 4th subframe {P0,GS} code | 5 |

The bits are positioned in the frame according to their importance. The inventors of the immediate application have carefully evaluated the performance of devices employing speech encoders, and identified the relative importance of the bits in a speech frame, as listed in tables 3 and 4.

TABLE 3

Importance of encoded bits for unvoiced speech frames (MODE 0).

| Variable Class | Parameter Name | Parameter Number | Bit Number |
|---|---|---|---|
| 1 | MODE | 0 | b0, b1 |
|   | R0 | 1 | b2 |
| 2 | R0 | 1 | b3 |
|   | LPC1 | 2 | b7 |
| 3 | R0 | 1 | b4 |
|   | LPC1 | 2 | b8, b9, b10, b11 |
|   | LPC2 | 3 | b18, b19 |
|   | GSP0–1 | 8 | b50, b51 |
|   | GSP0–2 | 11 | b69, b70 |
|   | GSP0–3 | 14 | b88, b89 |
|   | GSPO–4 | 17 | b107, b108 |
| 4 | LPC1 | 2 | b12, b13 |
|   | LPC2 | 3 | b20 |
|   | LPC3 | 4 | b27, b28, b29 |
|   | GSP0–1 | 8 | b52 |
|   | GSP0–2 | 11 | b71 |
|   | GSP0–3 | 14 | b90 |
|   | GSP0–4 | 17 | b109 |
| 5 | R0 | 1 | b5, b6 |
|   | LPC1 | 2 | b14, b15, b16, b17 |
|   | LPC2 | 3 | b21, b22, b23, b24, b25, b26 |
|   | LPC3 | 4 | b30, b31, b32, b33, b34 |
|   | INT_LPC | 5 | b35 |
|   | GSP0–1 | 8 | b53, b54 |
|   | GSP0–2 | 11 | b72, b73 |
|   | GSP0–3 | 14 | b91, b92 |
|   | GSP0–4 | 17 | b110, b111 |
| 6 | CODE1_1 | 6 | b36, b37, b38, b39, b40, b41, b42 |
|   | CODE2_1 | 7 | b43, b44, b45, b46, b47, b48, b49 |
|   | CODE1_2 | 9 | b55, b56, b57, b58, b59, b60, b61 |
|   | CODE2_2 | 10 | b62, b63, b64, b65, b66, b67, b68 |
|   | CODE1_3 | 12 | b74, b75, b76, b77, b78, b79, b80 |
|   | CODE2_3 | 13 | b81, b82, b83, b84, b85, b86, b87 |
|   | CODE1_4 | 15 | b93, b94, b95, b96, b97, b98, b99 |
|   | CODE2_4 | 16 | b100, b101, b102, b103, b104, b105, b106 |

TABLE 4

Importance of encoded bits for voiced speech frames (MODE 1, 2, or 3).

| Variable Class | Parameter Name | Parameter Number | Bit Number |
|---|---|---|---|
| 1 | MODE | 0 | b0, b1 |
|   | R0 | 1 | b2, b3, b4 |
|   | LPC1 | 2 | b7, b8, b9, b10, b11 |
|   | LAG_1 | 6 | b36, b37, b38 |
| 2 | R0 | 1 | b5 |
|   | LPC1 | 2 | b12, b13, b14, b15 |
|   | LPC2 | 3 | b18, b19 |
|   | LAG_1 | 6 | b39, b40, b41 |
|   | LAG_2 | 9 | b58, b59 |
|   | LAG_3 | 12 | b76, b77 |
|   | LAG_4 | 15 | b94 |
| 3 | R0 | 1 | b6 |
|   | LPC1 | 2 | b16, b17 |
|   | LPC2 | 3 | b20, b21, b22 |
|   | LPC3 | 4 | b27, b28, b29, b30 |
|   | LAG_4 | 15 | b95 |
|   | GSP0_1 | 8 | b53 |
|   | GSP0_2 | 11 | b71 |
|   | GSP0_3 | 14 | b89 |
|   | GSP0_4 | 17 | b107 |
| 4 | LPC2 | 3 | b23, b24 |
|   | LPC3 | 4 | b31, b32 |
|   | LAG_1 | 6 | b42 |
|   | LAG_2 | 9 | b60 |
|   | LAG_3 | 12 | b78 |
|   | GSP0_1 | 8 | b54, b55 |

TABLE 4-continued

Importance of encoded bits for voiced speech frames (MODE 1, 2, or 3).

| Variable Class | Parameter Name | Parameter Number | Bit Number |
|---|---|---|---|
| | GSP0_2 | 11 | b72, b73 |
| | GSP0_3 | 14 | b90, b91 |
| | GSP0_4 | 17 | b108, b109 |
| 5 | LPC2 | 3 | b25, b26 |
| | LPC3 | 4 | b33, b34 |
| | INT_LPC | 5 | b35 |
| | LAG_1 | 6 | b43 |
| | LAG_2 | 9 | b61 |
| | LAG_3 | 12 | b79 |
| | LAG_4 | 15 | b96, b97 |
| | GSP0_1 | 8 | b56, b57 |
| | GSP0_2 | 11 | b74, b75 |
| | GSP0_3 | 14 | b92, b93 |
| | GSP0_4 | 17 | b110, b111 |
| 6 | CODE_1 | 7 | b44–b52 |
| | CODE_2 | 10 | b62–b70 |
| | CODE_3 | 13 | b80–b88 |
| | CODE_4 | 16 | b98–b106 |

Thus it can be seen that the order of the encoded speech bits in the FEC encoder depends on the MODE.

Table 5 lists the reordered sequence of bits for unvoiced frames output by framing circuit 305, wherein the b value (for example b0) is the bit number before reordering and the number immediately to the right of the b value (for example 94) is the bit position. Thus, bit 0 (b0) of the original frame is in position 94 (the 95th bit) in the reordered frame. Those bits which are not assigned are indicated by a prefix "u".

TABLE 5

Speech bit re-ordering prior to FEC encoding for unvoiced speech frames (MODE = 0) and after.

| b0 | 94 | b28 | 12 | b56 | 44 | b84 | 36 |
| b1 | 93 | b29 | 13 | b57 | 43 | b85 | u16 |
| b2 | 92 | b30 | 14 | b58 | 42 | b86 | u15 |
| b3 | 91 | b31 | 15 | b59 | 41 | b87 | u14 |
| b4 | 89 | b32 | 16 | b60 | 40 | b88 | 82 |
| b5 | 0 | b33 | 17 | b61 | 18 | b89 | 75 |
| b6 | 38 | b34 | 37 | b62 | 19 | b90 | 4 |
| b7 | 90 | b35 | 39 | b63 | 20 | b91 | 66 |
| b8 | 88 | b36 | 59 | b64 | 21 | b92 | 61 |
| b9 | 87 | b37 | 58 | b65 | 22 | b93 | u13 |
| b10 | 86 | b38 | 57 | b66 | 23 | b94 | u12 |
| b11 | 85 | b39 | 56 | b67 | 24 | b95 | u11 |
| b12 | 73 | b40 | 55 | b68 | 25 | b96 | u10 |
| b13 | 72 | b41 | 54 | b69 | 83 | b97 | u9 |
| b14 | 71 | b42 | 53 | b70 | 76 | b98 | u8 |
| b15 | 70 | b43 | 52 | b71 | 3 | b99 | u7 |
| b16 | 69 | b44 | 51 | b72 | 67 | b100 | u6 |
| b17 | 6 | b45 | 50 | b73 | 62 | b101 | u5 |
| b18 | 80 | b46 | 49 | b74 | 26 | b102 | u4 |
| b19 | 79 | b47 | 48 | b75 | 27 | b103 | u3 |
| b20 | 78 | b48 | 47 | b76 | 28 | b104 | u2 |
| b21 | 7 | b49 | 46 | b77 | 29 | b105 | u1 |
| b22 | 8 | b50 | 84 | b78 | 30 | b106 | u0 |
| b23 | 9 | b51 | 77 | b79 | 31 | b107 | 81 |
| b24 | 10 | b52 | 2 | b80 | 32 | b108 | 74 |
| b25 | 11 | b53 | 68 | b81 | 33 | b109 | 5 |
| b26 | 64 | b54 | 63 | b82 | 34 | b110 | 65 |
| b27 | 1 | b55 | 45 | b83 | 35 | b111 | 60 |

Table 6 lists the bit sequence of voice frames output by the framing circuit 305 for speech frames.

TABLE 6

Speech bit re-ordering prior to FEC encoding for voiced speech frames (MODE = 1, 2, or 3).

| b0 | 94 | b28 | 63 | b56 | 17 | b84 | 33 |
| b1 | 93 | b29 | 62 | b57 | 18 | b85 | u16 |
| b2 | 92 | b30 | 60 | b58 | 19 | b86 | u15 |
| b3 | 91 | b31 | 59 | b59 | 20 | b87 | u14 |
| b4 | 83 | b32 | 58 | b60 | 21 | b88 | u13 |
| b5 | 72 | b33 | 48 | b61 | 22 | b89 | u12 |
| b6 | 65 | b34 | 46 | b62 | 23 | b90 | u11 |
| b7 | 90 | b35 | 44 | b63 | 24 | b91 | u10 |
| b8 | 89 | b36 | 86 | b64 | 25 | b92 | u9 |
| b9 | 88 | b37 | 85 | b65 | 5 | b93 | 7 |
| b10 | 87 | b38 | 84 | b66 | 9 | b94 | 11 |
| b11 | 82 | b39 | 76 | b67 | 13 | b95 | 15 |
| b12 | 81 | b40 | 75 | b68 | 36 | b96 | 38 |
| b13 | 80 | b41 | 71 | b69 | 40 | b97 | 42 |
| b14 | 79 | b42 | 57 | b70 | 26 | b98 | u8 |
| b15 | 0 | b43 | 53 | b71 | 27 | b99 | u7 |
| b16 | 1 | b44 | 74 | b72 | 28 | b100 | u6 |
| b17 | 67 | b45 | 70 | b73 | 29 | b101 | u5 |
| b18 | 78 | b46 | 56 | b74 | 34 | b102 | u4 |
| b19 | 77 | b47 | 52 | b75 | 35 | b103 | u3 |
| b20 | 2 | b48 | 73 | b76 | 30 | b104 | u2 |
| b21 | 3 | b49 | 69 | b77 | 31 | b105 | u1 |
| b22 | 4 | b50 | 55 | b78 | 32 | b106 | u0 |
| b23 | 64 | b51 | 51 | b79 | 6 | b107 | 8 |
| b24 | 61 | b52 | 68 | b80 | 10 | b108 | 12 |
| b25 | 49 | b53 | 54 | b81 | 14 | b109 | 16 |
| b26 | 45 | b54 | 50 | b82 | 37 | b110 | 39 |
| b27 | 66 | b55 | 47 | b83 | 41 | b111 | 43 |

The framing circuit 305 thus positions the bits having the most importance such that they enter the FEC encoder 318 last.

Figure 7:
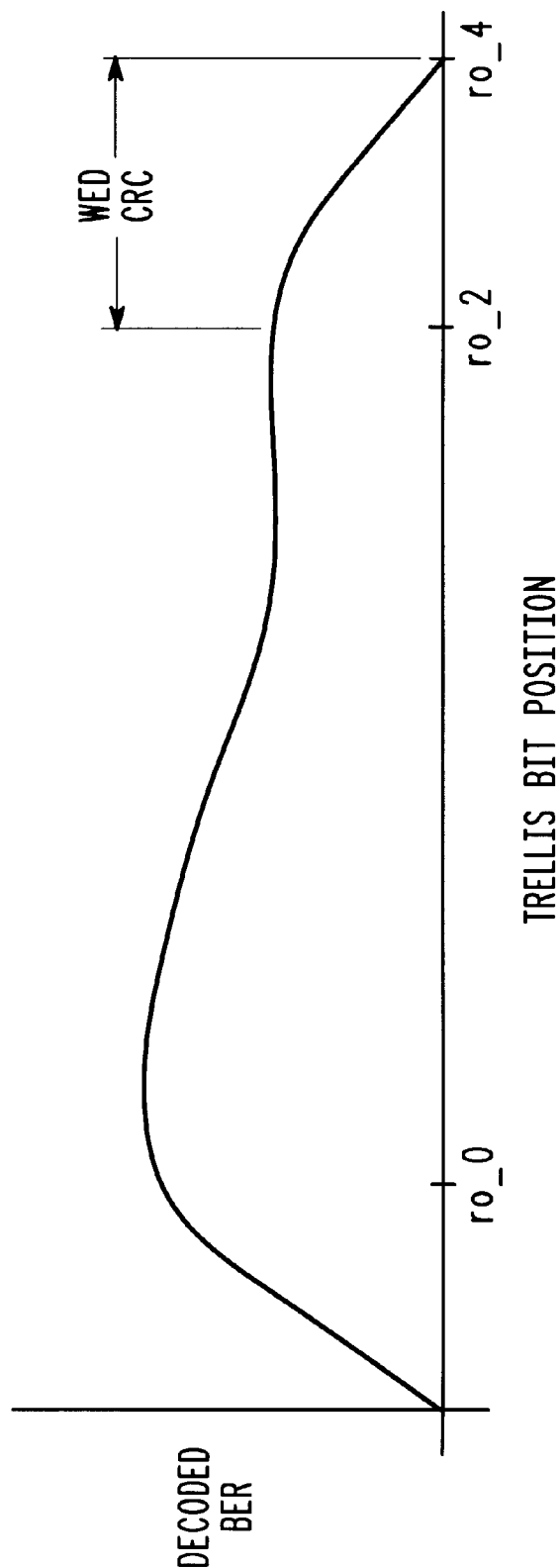
FIG. 7 is a diagram illustrating decoded bit error rate (BER) as a function of bit position of the output of the decoder.

FIG. 7 shows the trellis bit position versus bit error rate for a decoded speech frame in a GSM system. As can be seen, the bit error rate is lowest for bits positioned near the front and the back of the trellis. Applicant's have therefore determined that the highest priority bits should be positioned at the front and back of the trellis after reordering in the framing circuit for highest quality speech.

Figure 8:
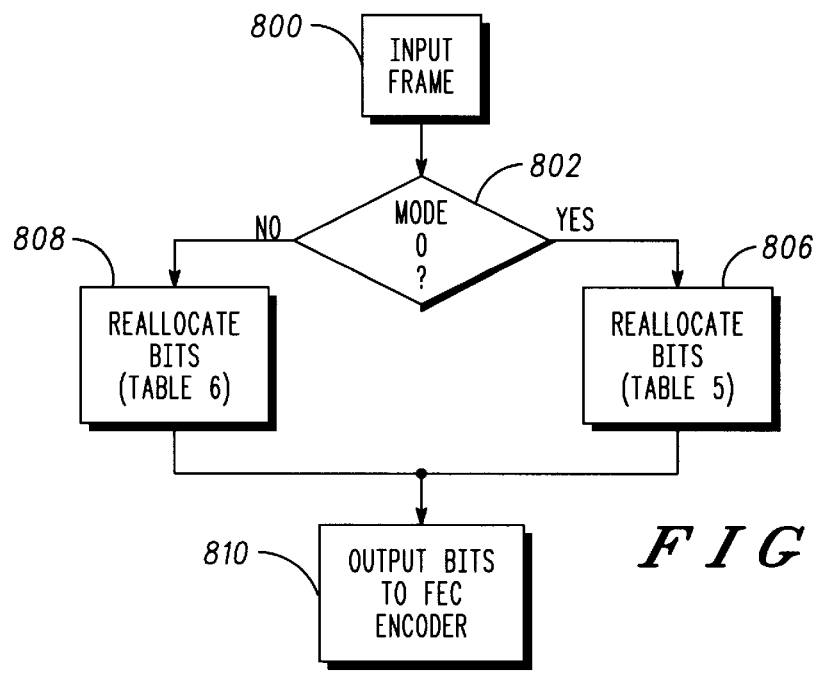
FIG. 8 is a flow chart representing repositioning of the bits of a frame in an encoder.

The operation of the coding system will now be described with reference to the FIGS. 8–10. Prior to encoding in the FEC encoder 318 of FIG. 3, a frame is encoded in the framing circuit 305 as indicated in block 800 (FIG. 8). It is initially determined whether the frame is an unvoiced speech frame or a voiced speech frame, in decision block 802. If the frame is an unvoiced speech frame (Mode 0, Table 1), the bits are reordered, or reallocated, to the positions identified in Table 5, as indicated in block 806. In this table, the b number on the left represents the original frame position and the number to the immediate right of the b value is the new bit position. Thus, after reordering the bits, bit 0 (b0) is moved to position 94; bit 1 (b1) is moved to position 93; and bit 28 (b28) is moved to position 12. If the word is a voiced speech frame (Modes 1, 2, and 3), as determined at decision block 802, the bits are reallocated according to table 6, as indicated in block 808. The b values and numbers to the right thereof represent the original bit position and the reordered bit position in table 6. The reordered bits are output to the FEC encoder (218 in FIG. 2) as indicated in block 810. The FEC encoder 318, interleaver 320, and transmitter 105 condition the encoded signal for transmission through signal channel 106 (see FIG. 3).

The receiver 121 (FIG. 3) demodulates the received signal. A soft decision is made as to the data bit levels using soft decision circuit 322. The interleaved data is restored in deinterleaver 324, which is complementary to interleaver 320. The FEC decoder 326 receives deinterleaved bits from deinterleaver 324, as indicated in block 900 (FIG. 9). The input bits are input serially to the squared Euclidean distance generator 550, which outputs a sum (from 1 to n) of the squared Euclidean distance $(\rho_i - S_i)^2$, as indicated in block 902, wherein $\rho_i$ is the input data bit from the deinterleaver and $s_i$ is a predicted bit value in the trellis decoder. This summation value is output to the adder 552.

A probability is generated from the bits of the previous frame stored in a previous frame storage circuit 545, as indicated in block 904. These bits are individually input to the memory circuit 542. The memory circuit 542 stores probabilities P{k/j} which are illustrated in Table 7.

Table 7 lists the probabilities P{j/k)} for each of the 95 bits entering the FEC encoder 318 (of FIG. 3), where P{j/k} is the probability that the bit in the current frame has value j if the value of the bit in the same bit position of the previous frame had value k. A value of 1.0 means that the bit always has the same value as the previous frame (a high frame-to-frame correlation relationship) and a value of 0.5 means that the value of the bit is completely independent of the value in the previous frame (a low frame-to-frame correlation relationship).

TABLE 7

Conditional probabilities of speech bit value conditioned on the bit value of the previous speech frame.

| Bit | P{1\|1} | P{1\|0} | P{0\|1} | P{1\|1} |
|---|---|---|---|---|
| 0 | 0.609 | 0.391 | 0.438 | 0.562 |
| 1 | 0.576 | 0.424 | 0.410 | 0.590 |
| 2 | 0.520 | 0.480 | 0.312 | 0.688 |
| 3 | 0.603 | 0.397 | 0.398 | 0.602 |
| 4 | 0.562 | 0.438 | 0.369 | 0.631 |
| 5 | 0.584 | 0.416 | 0.393 | 0.607 |
| 6 | 0.547 | 0.453 | 0.354 | 0.646 |
| 7 | 0.506 | 0.494 | 0.332 | 0.668 |
| 8 | 0.569 | 0.431 | 0.365 | 0.635 |
| 9 | 0.471 | 0.529 | 0.392 | 0.608 |
| 10 | 0.456 | 0.544 | 0.398 | 0.602 |
| 11 | 0.500 | 0.500 | 0.427 | 0.573 |
| 12 | 0.493 | 0.507 | 0.387 | 0.613 |
| 13 | 0.551 | 0.449 | 0.456 | 0.544 |
| 14 | 0.485 | 0.515 | 0.442 | 0.558 |
| 15 | 0.520 | 0.480 | 0.460 | 0.540 |
| 16 | 0.479 | 0.521 | 0.438 | 0.562 |
| 17 | 0.484 | 0.516 | 0.481 | 0.519 |
| 18 | 0.478 | 0.522 | 0.489 | 0.511 |
| 19 | 0.494 | 0.506 | 0.501 | 0.499 |
| 20 | 0.501 | 0.499 | 0.520 | 0.480 |
| 21 | 0.498 | 0.502 | 0.522 | 0.478 |
| 22 | 0.517 | 0.483 | 0.508 | 0.492 |
| 23 | 0.504 | 0.496 | 0.498 | 0.502 |
| 24 | 0.505 | 0.495 | 0.494 | 0.506 |
| 25 | 0.494 | 0.506 | 0.512 | 0.488 |
| 26 | 0.481 | 0.519 | 0.484 | 0.516 |
| 27 | 0.498 | 0.502 | 0.504 | 0.496 |
| 28 | 0.507 | 0.493 | 0.499 | 0.501 |
| 29 | 0.503 | 0.497 | 0.504 | 0.496 |
| 30 | 0.509 | 0.491 | 0.492 | 0.508 |
| 31 | 0.499 | 0.501 | 0.510 | 0.490 |
| 32 | 0.495 | 0.505 | 0.501 | 0.499 |
| 33 | 0.470 | 0.530 | 0.491 | 0.509 |
| 34 | 0.509 | 0.491 | 0.503 | 0.497 |
| 35 | 0.509 | 0.491 | 0.511 | 0.489 |
| 36 | 0.487 | 0.513 | 0.462 | 0.538 |
| 37 | 0.527 | 0.473 | 0.473 | 0.527 |
| 38 | 0.609 | 0.391 | 0.502 | 0.498 |
| 39 | 0.459 | 0.541 | 0.420 | 0.580 |
| 40 | 0.514 | 0.486 | 0.503 | 0.497 |
| 41 | 0.531 | 0.469 | 0.495 | 0.505 |
| 42 | 0.507 | 0.493 | 0.521 | 0.479 |
| 43 | 0.491 | 0.509 | 0.488 | 0.512 |
| 44 | 0.390 | 0.610 | 0.295 | 0.705 |
| 45 | 0.504 | 0.496 | 0.468 | 0.532 |
| 46 | 0.500 | 0.500 | 0.404 | 0.596 |
| 47 | 0.473 | 0.527 | 0.494 | 0.506 |
| 48 | 0.506 | 0.494 | 0.397 | 0.603 |
| 49 | 0.527 | 0.473 | 0.452 | 0.548 |
| 50 | 0.540 | 0.460 | 0.487 | 0.513 |
| 51 | 0.503 | 0.497 | 0.505 | 0.495 |
| 52 | 0.483 | 0.517 | 0.488 | 0.512 |
| 53 | 0.478 | 0.522 | 0.483 | 0.517 |
| 54 | 0.574 | 0.426 | 0.553 | 0.447 |
| 55 | 0.530 | 0.470 | 0.528 | 0.472 |
| 56 | 0.525 | 0.475 | 0.520 | 0.480 |
| 57 | 0.505 | 0.495 | 0.513 | 0.487 |
| 58 | 0.504 | 0.496 | 0.376 | 0.624 |
| 59 | 0.535 | 0.465 | 0.374 | 0.626 |
| 60 | 0.577 | 0.423 | 0.401 | 0.599 |
| 61 | 0.520 | 0.480 | 0.458 | 0.542 |
| 62 | 0.664 | 0.336 | 0.353 | 0.647 |
| 63 | 0.599 | 0.401 | 0.310 | 0.690 |
| 64 | 0.519 | 0.481 | 0.384 | 0.616 |
| 65 | 0.538 | 0.462 | 0.492 | 0.508 |
| 66 | 0.649 | 0.351 | 0.293 | 0.707 |
| 67 | 0.490 | 0.510 | 0.445 | 0.555 |
| 68 | 0.425 | 0.575 | 0.379 | 0.621 |
| 69 | 0.569 | 0.431 | 0.559 | 0.441 |
| 70 | 0.586 | 0.414 | 0.540 | 0.460 |
| 71 | 0.542 | 0.458 | 0.478 | 0.522 |
| 72 | 0.608 | 0.392 | 0.439 | 0.561 |
| 73 | 0.476 | 0.524 | 0.372 | 0.628 |
| 74 | 0.452 | 0.548 | 0.362 | 0.638 |
| 75 | 0.555 | 0.445 | 0.396 | 0.604 |
| 76 | 0.633 | 0.367 | 0.322 | 0.678 |
| 77 | 0.715 | 0.285 | 0.390 | 0.610 |
| 78 | 0.738 | 0.262 | 0.223 | 0.777 |
| 79 | 0.604 | 0.396 | 0.368 | 0.632 |
| 80 | 0.533 | 0.467 | 0.295 | 0.705 |
| 81 | 0.546 | 0.454 | 0.245 | 0.755 |
| 82 | 0.588 | 0.412 | 0.265 | 0.735 |
| 83 | 0.664 | 0.336 | 0.258 | 0.742 |
| 84 | 0.720 | 0.280 | 0.220 | 0.780 |
| 85 | 0.736 | 0.264 | 0.256 | 0.744 |
| 86 | 0.761 | 0.239 | 0.224 | 0.776 |
| 87 | 0.582 | 0.418 | 0.246 | 0.754 |
| 88 | 0.740 | 0.260 | 0.291 | 0.709 |
| 89 | 0.762 | 0.238 | 0.254 | 0.746 |
| 90 | 0.705 | 0.295 | 0.150 | 0.850 |
| 91 | 0.865 | 0.135 | 0.357 | 0.643 |
| 92 | 0.890 | 0.110 | 0.104 | 0.896 |
| 93 | 0.653 | 0.347 | 0.281 | 0.719 |
| 94 | 0.886 | 0.114 | 0.176 | 0.824 |

For example, if bit b0 in bit position 94 (reordered) in the previous frame was 0, the probability that it will be 0 in the current frame is 0.886; if the previous bit b0 in bit position 94 in the previous frame was 0, the probability that the bit in the same bit position of the current frame will be 1 is 0.114; if the value of bit b0 (position 94) in the previous frame was 1, the probability that it will be 0 in the next frame is 0.176; if the previous bit b0 (position 94) was 1, the probability that the next bit will be will be 1 is 0.824. The trellis contains 95 data bits, 3 cycle redundancy check (CRC) bits, and 6 tail bits, which requires 104 time units. Each time unit in turn has 64 ACSs. Each ACS involves two branch metrics. Each branch metric has a correlation value. Accordingly, branch metric generator 540 outputs two values for each point on the trellis. For example, the correlation values output of memory 442 is 0.886 and 0.114 when the input to the memory for the previous frame is 0 for bit position 94. The correlation values output by memory 442 are 0.176 and 0.824 when the input to the memory is 1 for bit position 94. Each of the bits of the previous frame is sequentially input to the memory circuit 542, and the value of the bit in the same bit position as the bit being decoded in trellis decoder 434 for the current frame, is used to calculate respective branch metrics for that frame.

Figure 9:
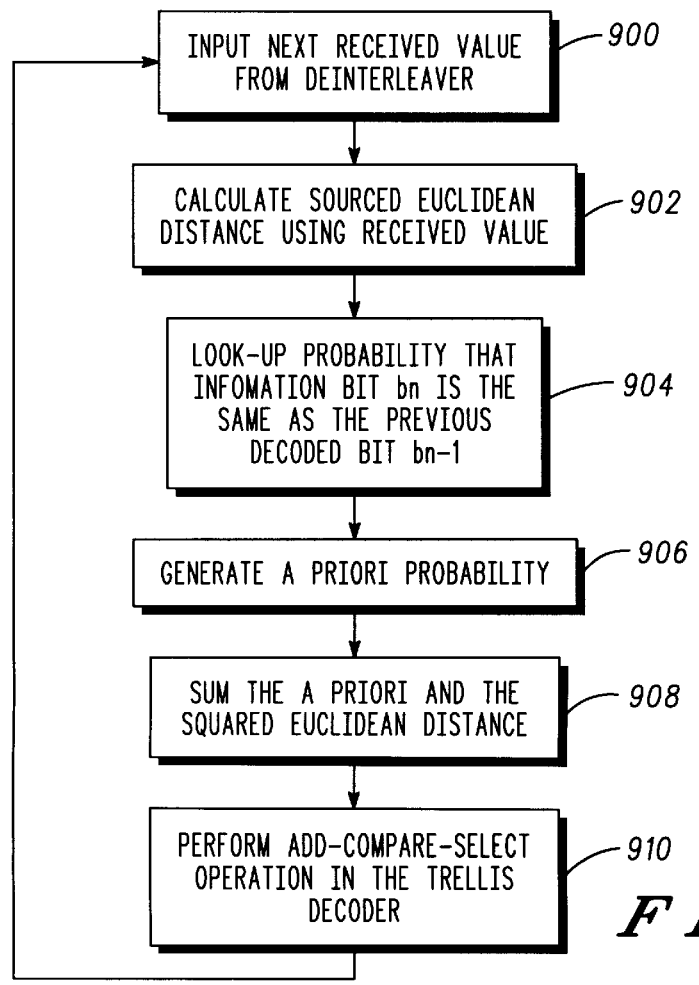
FIG. 9 is a flow chart representing decoding of the frame.

The a priori bias for each branch is generated in a priori bias circuit 660 (shown in FIG. 6) from the probability output by the memory, as indicated in block 906 (FIG. 9). The respective outputs of the a priori bias circuit are the product of a dc bias estimate ($2\hat{\sigma}^2$) on input 662 and a respective one of the natural logs of the two probabilities (lnP{j/k}) output from memory circuit 542 for each bit in the previous frame storage circuit 545. It will be recognized that the memory circuit 542 advantageously stores the values lnP{j/k}, such that the values output by the memory and input to a priori bias circuit are the natural log of the probability. Because the product $2\hat{\sigma}^2 \ln P\{j/k\}$ is a negative value, subtracting this negative value from the squared Euclidean distance is actually an addition. The product on conductor 664 is thus added to the summation of the squared Euclidean distance in adder 552. Adder 552 adds the squared Euclidean distance to the a priori values as indicated in block 908.

The trellis decoder 434 performs the add-compare-select operations, as indicated in block 910 (FIG. 9) for all the bits in a frame. The trellis decoder may be a feed forward type convolutional code decoder or a feed backward type convolutional code decoder. In either case, the trellis decoder uses the two metrics output by the adder 552 and associated with a possible bit value to select a best path to points in the trellis (e.g., A, B, C, D) as a function of the last reliable frame.

Figure 11:
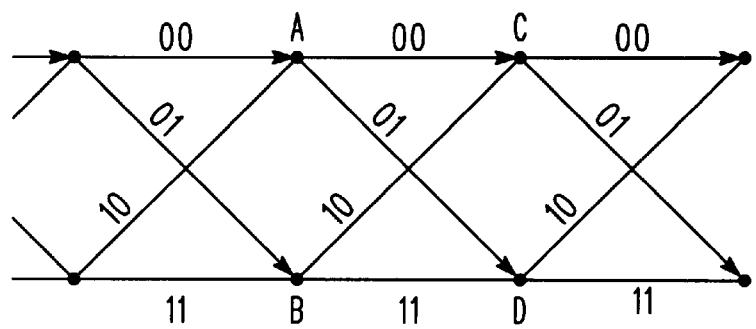
FIG. 11 illustrates a section of a trellis frame.

By way of example, the operation of a feed forward type decoder will be described for illustrative purposes based on the following considerations: that points C and D in FIG. 11 are associated with bit position 94, that the value in bit position 94 of the last reliable decoded frame was 0, that points A and C correspond to a value of 0, and that B and D correspond to a value of 1. The probability 0.886 (the probability P({0/0}) is used to generate the a priori bias circuit output $2\hat{\sigma}^2 \ln P\{j/k\}$ when generating the branch metric for path 00 to point C, since this is the probability that bit position 94 will have a value of 0 (point C) if bit position 94 in the last reliable frame had a value of 0. For the path 10 to point C, this probability 0.886 is used to generate the a priori bias circuit output.

The metric used for path 00 to point C is a function of a stored historic value (path metric) for reaching point A plus the branch metric output by adder 552 for path 00 (which will be the squared Euclidean distance associated with point C plus the a priori bias associated with point C which is a function of 0.886). The metric used for path 10 to point C is a function of a historic value (path metric) stored for point B plus the a priori bias circuit output for path 01 (which will be the squared Euclidean distance associated with point C plus the a priori bias circuit output for point C which is a function of 0.886). The metric for the two paths to point C having the better value will be selected for point C. The trellis decoder 434 performs similar calculations for paths 01 to point D and 11 to point D. The a priori bias circuit output value generated will be a function 0.114 (the probability Pf{1/0}) for both paths 01 and 11.

The resulting metric associated with the selected path to point C will be stored as the path metric to point C. The resulting metric associated with the selected path to point D will be stored as the path metric to point C. The frame-to-frame bit correlation value 0.886 will more heavily weight the metric path to point C than will 0.114 weight the metric for the paths to point D in this example, because of the high probability associated with the frame-to-frame correlation relationship of this bit position. Accordingly, the path through point C will be favored over the path to point D when selecting the best path through the trellis. This facilitates the selection of the best path through the trellis decoder in view of the frame to frame correlation of this bit position.

Those skilled in the art will recognize that the decoder circuit 326 performs similar calculations for all the points on the trellis within a frame. The data points selected for the best path through the trellis for the entire frame will be output by the trellis decoder. A determination will then be made as to whether the frame is reliable or unreliable. If it is a reliable frame, it will be stored in the previous frame storage circuit. If it is an unreliable frame, the frame will not be stored in the previous frame storage circuit. Thus, the frame stored in the previous frame storage circuit is always a good frame, and the probability calculation will always be based on the last reliable frame.

Those skilled in the art will also recognize that if the value of bit position 94 stored in the previous frame had been 1 in the above example, the branch metrics for paths 00 and 01 to point C would have been a function of probability 0.176, and the branch metrics for paths 10 and 11 to point D would have been a function of the probability 0.824. These probabilities represent the respective frame-to-frame probability P{1/0} for bit position 94 and the probability P{1/1} for bit position 94.

The operation of the invention with a feed backward type convolution code trellis decoder will now be described for illustrative purposes, based on the following considerations: that points A and B in FIG. 11 correspond to bit position 94; that points A and C represent a bit value of 0, and that bits B and D represent a value of 1; and in the last reliable decoded frame, bit position 94 had a value of 0. The probability 0.886 (the probability {0/0}) is used to generate the a priori bias circuit output $2\hat{\sigma}^2 \ln P\{j/k\}$ when generating the branch metric for path 00 between points A and C, since this is the probability that bit position 94 will have a value of 0 (point A) if the previous frame had a value of 0. For the path 10 between points B and C, the probability 0.114 is used to generate the a priori bias circuit output, since this is the probability that bit 94 will be 1 (point B) if the previous frame was 0.

The metric used for path 00 is a function of a stored historic value (path metric) for reaching point A plus the branch metric output by adder 552 for path 00 (which will be the squared Euclidean distance associated with point A plus the a priori bias associated with point A which is a function of 0.886). The metric used for path 10 to point C will be a function of a historic value (path metric) stored for point B plus the a priori bias circuit output for path 01 (which will be the squared Euclidean distance associated with point C plus the a priori bias circuit output for point C which is a function of 0.114). The path to point C having the better metric will be selected for point C, and stored.

The trellis decoder 434 performs similar calculations for path 01 between points A and D and path 11 between points B and D. The a priori bias circuit output will be a function 0.886 (the probability P{1/0} associated with point A) for path 01 and a function of 0.114 (the probability P{1/0} associated with point B) for path 11. The best metric for point D will be selected and stored as the path metric to point D.

The best path to point D will be selected from these metrics. Because the path through point A will be more heavily weighted to favor a value of 0 for bit position 94 when selecting the paths to both points, the trellis decoder will take advantage of the high frame-to-frame correlation associated with this bit position to more accurately select the value for bit position 94.

The stored historic metric (path metric) for the selected path to points C and D may include the a priori bias circuit output value or the a priori bias circuit output may be removed (subtracted) from the stored historic value to these points, in the backward looking trellis decoder.

The decoder circuit 326 performs similar calculations for all the points on the trellis within a frame. The data points selected for the best path through the trellis for the entire frame will be output by the trellis decoder. A determination will then be made as to whether the frame is reliable or unreliable. If it is a reliable frame, it will be stored in the previous frame storage circuit. If it is an unreliable frame, the frame will not be stored in the previous frame storage circuit. Thus, the frame stored in the previous frame storage circuit is always a good frame, and the probability calculation will always be based on the last reliable frame.

Figure 10:
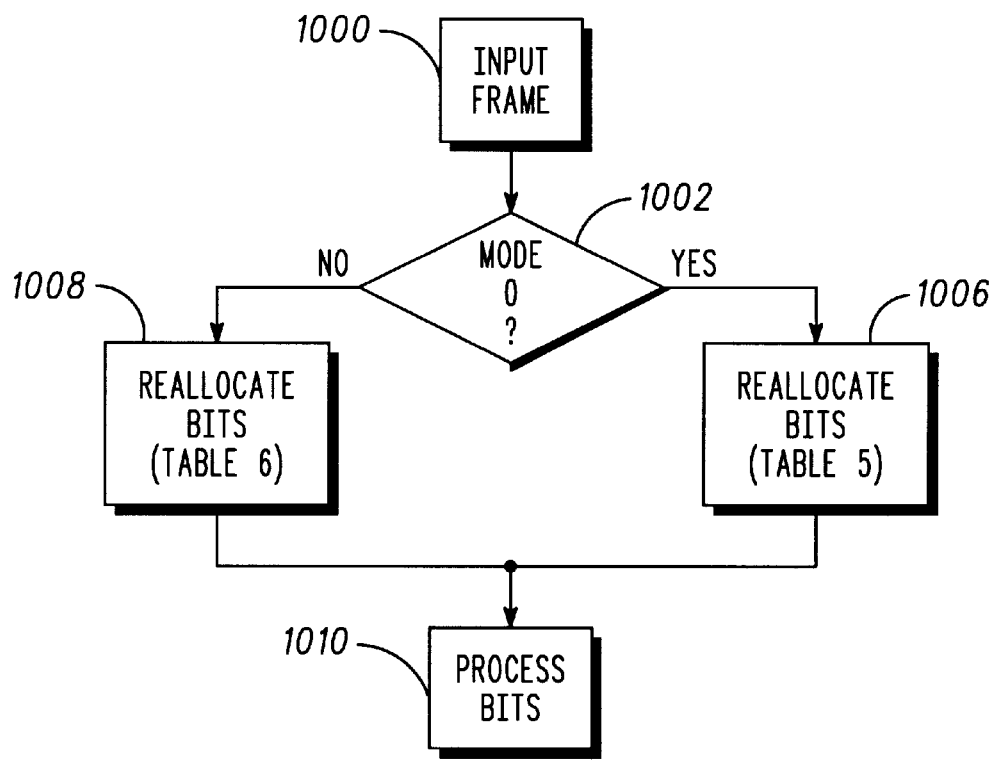
FIG. 10 is a flow chart representing repositioning of bits in a frame in a decoder.

The refraining circuit 330 (FIG. 3) is responsive to the output of the trellis decoder 434 in FEC decoder 326 to move the output bits back to their original position, as represented by the flow chart of FIG. 10. First, the reframing circuit inputs the frame from the trellis decoder, as indicated in block 1000. The decoder determines whether the frame is an unvoiced speech frame or a voiced speech frame, in decision block 1002. If the frame is an unvoiced speech frame (Mode 0, Table 1), the bits are reordered, or reallocated, to the positions identified in Table 5, as indicated in block 1006. In the decoder, the bits are repositioned from the received position, which is right of the bit b number, to the original position at the input of the source encoder, which is the b number. Thus, after reallocating, the bit in position 94 is moved to bit 0 (b0); the bit in position 93 is moved to bit 1 (b1); and the bit in position 12 is moved to bit 28 (b28). If the word is a voiced speech frame (Modes 1, 2, and 3), as determined at decision block 1002, the bits are reallocated according to Table 6, as indicated in block 1008. The reordered bits are processed in source decoder 328, as indicated in block 1010. The signals output by the source decoder are converted to an analog signal in DIA converter 332 (FIG. 3), amplified in an amplifier (not shown), and input to drive speaker 224.

A particularly advantageous aspect of the immediate invention is that the parameter bits can be repositioned for transmission such that they are located in a frame according to their importance. This is possible because the invention uses the bit-wise probability that allows all of the bits to be considered individually. For example, considering the "voicing mode" parameter, from Tables 1 and 2, it is always the first parameter out of the speech encoder (regardless of the mode) and it always consists of two bits, b0 and b1. From Tables 3 and 4, it can be seen that the b0 and b1 bits are always considered to be in the most important class and are essential for high quality speech. Tables 5 and 6 indicate that the b0 and b1 bits enter the FEC encoder as bits 94 and 93, respectively. Table 7 shows that bit 94 has frame-to-frame bit probabilities of P{0|0}=0.886, P{1|0}=0.114, P{0|1}= 0.176, P{1|1}=0.824. It is likely that bit position 94 (ak.a., b0) will have the same value as it did in the previous frame (i.e., it is unlikely that it will change). The present invention takes advantage of these characteristics to position that bit at a location where the bit error rate is low, and uses the high correlation rate to assure that the correct mode is identified from frame-to-frame. Additionally, the fact that the bits are processed individually, instead of together, allows two 2-by-2 metric matrices to be used instead of one 4-by-4 metric matrix for the parameter. This reduces the possible metric paths from 16 to 8, greatly simplifying the path selection in the forward error correction decoder.

In summary, the speech coder output consists of a bit stream of which certain bits have a high correlation with the bits from the previous frame. The bits with the highest correlation also tend to be the most important bits in the speech frame. These bits can be assigned the most protection offered by the FEC Coder using the invention.

It is envisioned that in operation, if the last decoded speech frame is considered unreliable (i.e., flagged as a bad frame by a CRC or other conventional error detection method), the current frame can be decoded using conventional decoding. Additionally, if a frame of N speech bits contains only L speech encoder data bits (L<N) which exhibit strong frame-to-frame bit correlation, then the novel branch metric can be used on those L bits and a conventional ML decoding metric can be used on the remaining N-L bits. Thus, the squared Euclidean distance may be used by the Viterbi decoder to select paths without employing the frame-to-frame correlation value until a frame is considered unreliable. If the current frame is considered unreliable (i.e., the frame value is unlikely), the last decoded frame considered reliable (i.e., not flagged as a bad frame by a CRC or other error detection method), is used to decode the current frame by employing the novel branch metric:

$$\sum_{i=1}^{N} (\rho_i - s_i)^2 - 2\hat{\sigma}^2 \ln P\{k/j\} \qquad (4)$$

wherein: $\rho_i$ is a received signal bit;

$s_i$ is a possible signal value (constellation point) output by a trellis encoder;

$\hat{\sigma}^2$ is an estimate of a variance of white Gaussian noise; and lnP{k/j} is a stored value representing a correlation between a possible bit value k on a trellis branch of a current frame and j is the decoded value of the same bit in a previous frame. Conventional Viterbi decoding is performed on the remaining N-L bits encoded in the frame.

Alternatively, the novel metric (equation 4) employing bit-wise frame-to-frame correlation values and the squared Euclidean distance is used for decoding those bits having a high frame-to-frame correlation relationship and the squared Euclidean distance of the ML decoder (equation 3) is employed without the frame-to-frame correlation value for those bits having a low frame-to frame correlation relationship. For example, bits having a low frame-to-frame correlation relationship would have probabilities in the range of 0.451 to 0.550. Bits having a probability in the range of 0 to 0.450 and 0.551 to 1.00 would be considered to have high frame-to-frame relationships. In this embodiment, the memory 442 is smaller as those bits having a low frame-to-frame correlation relationship do not have a probability metric matrix stored in the memory.

It is also envisioned that the frame-to-frame correlation metric can be used for all the bits in the trellis frame, regardless of the frame-to-frame correlation relationship of the bits.

The results achieved for a VSELP digital speech encoder, on a noisy channel (defined as a channel BER of 8.6%) using a conventional ML Viterbi decoder has a decoded BER of 1.98% for a 100 second speech file. For a decoder using the novel branch metric equation 4 for every branch in the trellis, the decoded BER decreases to 1.85%. The invention thus provides an average improvement of 7%. This is a humanly decipherable increase in speech quality. The performance is further enhanced because the decoded bits that have the strongest bit-wise correlation are moved to the positions having the lowest bit error rate. The effect of these bits are the most perceptible of the speech encoder bits. The inclusion of frame-to-frame bit-wise correlation in the metric benefits these bits in particular because of their high frame-to-frame correlation. The resulting speech quality improvement is thus effectively much more than 7%.

There is another significant benefit of the immediate invention. In many digital speech encoder systems, a "bad frame" strategy is employed to mitigate the effect of decoding errors on the output speech quality. For these strategies, the most significant speech bits are monitored at the output of the channel decoder. If an error is suspected in one of these bits, the speech frame is discarded. If such a bad frame strategy is used in a system employing the immediate invention, the invention will reduce the number of frames discarded because the most important bits have a high frame-to-frame correlation relationship, and significantly fewer errors in these bits occur as compared to conventional decoder methods.

An additional advantage of the invention is that it does not significantly add to the circuitry required to implement the decoder circuit. Many conventional decoders retain the previous frame for the situation where the next frame is discarded. Accordingly the previous frame data is available for processing without adding a significant amount of circuitry relative to existing systems.

The present invention is illustrated in a GSM cellular radiotelephone, wherein it is particularly advantageous. However, the invention may also be advantageously employed to decode signals communicated from low-rate speech coders and low-rate video coders where there is a frame-to-frame correlation of bits. The invention thus has application in Viterbi decoding of convolutional codes, punctured convolutional codes, trellis coded modulation, continuous phase modulation, partial response signaling systems, maximum-likelihood sequence estimation, block codes and block coded modulation. In addition to these specific Viterbi applications, the invention has application to the M-algorithm and generalized Viterbi algorithms.

Although the invention is described as generating a bit-wise probability from a bit in a single previous frame, the bit-wise probability may be generated from the bit values at the same bit position in a plurality of previous frames. The values stored in the memory are $P\{j/k,h\}$ in this embodiment, instead of $P\{j/k\}$. The value of $P\{j/k,h\}$ is the probability of the bit having value j if the bit value at the same position in the previous frame had value k and the bit value at the same position in the frame before that had value h. Thus the table is larger, and the probability is dependent upon the previous two frames.

The invention, which is illustrated with speech decoders, could alternatively be advantageously employed with any system wherein signals have high frame-to-frame correlation.

Accordingly it can be seen that an improved decoder is disclosed. The decoder uses the high frame-to-frame correlation of some bits to improve performance of the decoder. Additional improvements are made by positioning the most important bits at those positions having the lowest bit error rate.

What is claimed is:

1. A decoder circuit generating decoded frames of data including parameters having multiple bits with frame-to-frame correlation, the decoder circuit comprising:

an input for inputting input frames of bits;

a probability circuit coupled to the input, the probability circuit generating respective probabilities associated with respective bit positions, the probability circuit generating a respective probability for a single bit position within at least one of the parameters having multiple bits with frame-to-frame correlation, each of the respective probabilities being the probability that the single bit in the respective bit position has the same value as the single bit at the same respective bit position in a previous decoded frame;

a branch metric generator coupled to receive the respective probabilities and the input data bits and generating branch metrics as a function thereof; and and a decoder coupled to the branch metric generator, the decoder generating a decoded output frame as a function of the generated branch metrics.

2. The decoder circuit as defined in claim 1, wherein the probability circuit includes a memory circuit storing a respective probability for each of the respective bit positions.

3. The decoder circuit as defined in claim 2, wherein the memory circuit stores a plurality of probabilities associated with each of the respective bit positions.

4. The decoder circuit as defined in claim 3, wherein one of the plurality of probabilities associated with each of the respective bit positions is the probability that the bit value in the respective bit position in the previous decoded frame will be repeated and another of the plurality of probabilities associated with each of the respective bit positions is the probability that the bit value in the respective bit position of the previous decoded frame will change.

5. The decoder circuit as defined in claim 4, further including a previous decoded frame storage circuit coupled between an output of the decoder and an input of the memory circuit, the previous decoded frame storage circuit storing the previous decoded frame.

6. The decoder circuit as defined in claim 5, wherein the branch metric generator includes a squared Euclidean distance generator coupled to the input.

7. The decoder circuit as defined in claim 6, wherein the decoder is a trellis decoder.

8. The decoder circuit as defined in claim wherein the branch metric generator further includes an adder and a squared Euclidean distance circuit, the output of the squared Euclidean distance circuit coupled the adder.

9. The decoder circuit as defined in claim 8, wherein the branch metric generator further includes an a priori circuit to the adder, the adder adding an output of the a priori circuit and an output of the squared Euclidean distance circuit to produce the branch metric.

10. The decoder circuit as defined in claim 1, wherein respective probalities are only used for those bit positions having a high frame-to-frame correlation.

11. The decoder circuit as defined in claim 1, wherein each of the respective probabilities are generated as a function of bit values of the bits in the same bit position of more than one previous decoded frame.

12. The decoder circuit as defined in claim 1, wherein the decoder uses a squared Euclidean distance and a respective probability to select a path for bits having a high frame-to-frame correlation, and the decoder uses only a squared Euclidean distance to select a path for bits having a low frame-to-frame correlation relationship.

13. The decoder circuit as defined in claim 7, wherein the decoder is a trellis decoder and the branch metric generator generates branch metrics having values according to:

$$\sum_{i=1}^{N}(\rho_i - s_i)^2 - 2\hat{\sigma}^2 \ln P\{k/j\}$$

wherein $r_i$ is a received signal bit;

$s_i$ is in a possible signal constellation which is output by the trellis decoder;

$\hat{\sigma}^2$ is an estimate of a variance of white Gaussian noise; and $\ln P\{k/j\}$ is a metric value stored for bit i in frame m representing a correlation between a possible bit value k on a trellis branch for bit position i of a current frame and j is a value of a bit in position i in a previous decoded frame.

14. The decoder circuit according to claim 13, wherein the branch metric generator includes a memory storing values $\ln P\{v/j\}$ for each of at least predetermined bits of a frame.

15. A radiotelephone comprising:

an antenna for detecting radio frequency signals;

a receiver coupled to the antenna for demodulating signals input by the antenna and for generating demodulated output signals responsive thereto; and a decoder circuit coupled to the receiver for decoding the demodulated output signals, the decoder circuit including a trellis decoder selecting paths as a function of a branch metric, a storage circuit coupled to the trellis decoder for storing at least one frame, each frame including parameters having multiple bits with frame-to-frame correlation;

a memory circuit coupled to the storage circuit to output respective probabilities that a single bit of a previous decoded frame will have a same value or a changed value with respect to a single bit value in a same bit position in a frame stored in the storage circuit, the memory circuit storing a respective probability for a single bit position within at least one of the parameters having multiple bits with frame-to-frame correlation;

an a priori circuit coupled to the memory circuit and generating an output value responsive to the probabilities stored in the memory circuit;

a distance generating circuit outputting distance signals as a function of distances between an input data value and a possible bit value associated by the decoder circuit with the input data value; and an adder coupled to the memory circuit and the distance generating circuit, the adder generating the branch metric as a function of the respective probabilities and the distance signals.

16. A method of transmitting a signal frame comprising the steps of:

arranging transmission bits from an original order of the signal frame to a new order on a bit-by-bit basis independently of parameters making up the signal frame to form a transmission data sequence;

transmitting the transmission data sequence over a signal channel;

receiving receive bits from the signal channel including a data sequence associated with the transmission data sequence;

arranging the received bits such that they are in the original order; and decoding the receive bits arranged in the original order in a forward error correction decoder to generate decoded bits, the forward error correction decoder using branch metrics generated using bit-wise frame-to-frame correlation values, the bit-wise frame-to-frame correlation values including a probability that a single bit position of a parameter of a frame having multiple bits with frame-to-frame correlation will have the same value in sequential frames.

17. A decoder circuit comprising:

a circuit input for receipt of input data bits of an input frame having parameters that include multiple bits with frame-to-frame correlation;

circuitry having an input and an output, the input coupled to receive a data sequence of an output frame having parameters that include multiple bits with frame-to-frame correlation, and the circuitry storing respective probabilities associated with respective bits in at least predetermined bit positions of the input frame, each of the respective probabilities being the probability that a single bit in the respective bit position of the input frame has the same value as a single bit in the same bit position of the output frame, at least one of the probabilities being the probability that one of the bits in a parameter that include multiple bits with frame-to-frame correlation has the same value in the input and output frames;

a branch metric generator coupled to receive the respective probabilities and the input data bits and generating branch metrics as a function thereof; and a decoder coupled to the branch metric generator to receive the branch metrics therefrom and responsive thereto to generate the data sequence of the output frame at an output thereof, the input of the circuitry coupled to the output of the decoder.

18. The decoder circuit as defined in claim 17, wherein the probability circuit includes a memory circuit storing the respective probabilities for each of the at least predetermined bit positions, an input of the memory circuit couple to the input of the circuitry.

19. The decoder circuit as defined in claim 18, wherein the memory circuit stores a plurality of probabilities associated with each of the at least predetermined bit positions, wherein one of the plurality of probabilities associated with each of the at least predetermined bit positions is a probability that a value of the bit in the respective bit position will be repeated and another of the plurality of probabilities associated with each of the at least predetermined bit positions is a probability that a value of the bit in the respective bit position will change.

20. The decoder circuit as defined in claim 19, further including a previous decoded frame storage circuit coupled between the output of the decoder and the input of the memory circuit.

21. The decoder circuit as defined in claim 20, wherein the decoder is a trellis decoder.

22. The decoder circuit as defined in claim 19, wherein the respective probabilities are generated as a function of bit values in the same bit position of more than one previous decoded frame.

23. The decoder circuit as defined in claim 19, wherein the decoder uses a squared Euclidean distance and a probability to select a path for bit positions having a high frame-to-frame correlation, and the decoder uses a squared Euclidean distance to select a path for those bit positions having a low frame-to-frame correlation relationship.

24. A method of decoding an input frame comprising input data bits to produce an output frame comprising output data bits, the input and output frames having parameters having multiple bits with frame-to-frame correlation, the method comprising the steps of:

obtaining a frame-to-frame probability that an input bit at a respective bit position of a parameter having multiple bits with frame-to-frame correlation of the input frame is the same as the output bit in the same respective bit position of a parameter having multiple bits with frame-to-frame correlation of a previous decoded frame;

generating a branch probability as a function of the frame-to-frame probability for the respective bit position;

generating a branch metric as a function of the branch probability and the input data sequence of the input frame;

generating an output data bit corresponding to the input data bit in the respective bit position as a function of the branch metric; and repeating the steps for the bits of the input frame.

25. The method as defined in claim 24, wherein the step of obtaining comprises recalling from a memory the probability that the bit value of the respective bit position will be repeated and the probability that the bit value of the respective bit-position will change.

* * * * *

UNITED STATES PATENT AND TRADEMARK OFFICE
CERTIFICATE OF CORRECTION

PATENT NO. : 6,215,831 B1
DATED : April 10, 2001
INVENTOR(S) : Nowack, Joseph M. et al.

It is certified that error appears in the above-identified patent and that said Letters Patent is hereby corrected as shown below:

Column 18,
Line 43, please add -- 7 -- after the word "claim" and before "wherein".
Line 65, please change "claim 7" to -- claim 1 --.

Column 19,
Line 19, please change "{v/j}" to -- {k/j} --.

Signed and Sealed this

Twenty-ninth Day of July, 2003

JAMES E. ROGAN
*Director of the United States Patent and Trademark Office*